(12) United States Patent
Wang et al.

(10) Patent No.: US 8,258,411 B2
(45) Date of Patent: Sep. 4, 2012

(54) PRINTED CIRCUIT BOARD WITH IMPROVED VIA DESIGN

(75) Inventors: Alan E. Wang, Gibsonia, PA (US); Kevin C. Olson, Wexford, PA (US)

(73) Assignee: PPG Industries Ohio, Inc, Cleveland, OH (US)

( * ) Notice: Subject to any disclaimer, the term of this patent is extended or adjusted under 35 U.S.C. 154(b) by 238 days.

(21) Appl. No.: 12/548,933

(22) Filed: Aug. 27, 2009

(65) Prior Publication Data

US 2010/0012357 A1    Jan. 21, 2010

Related U.S. Application Data

(60) Division of application No. 11/868,085, filed on Oct. 5, 2007, now abandoned, which is a division of application No. 11/442,016, filed on May 26, 2006, now abandoned, which is a continuation-in-part of application No. 10/987,480, filed on Nov. 11, 2004, now Pat. No. 7,485,812, which is a continuation-in-part of application No. 10/227,768, filed on Aug. 26, 2002, now Pat. No. 6,844,504, which is a continuation-in-part of application No. 10/184,387, filed on Jun. 27, 2002, now Pat. No. 6,951,707.

(51) Int. Cl.
*H05K 1/11* (2006.01)
(52) U.S. Cl. .................................. 174/262; 174/255
(58) Field of Classification Search ............... 174/255
See application file for complete search history.

(56) References Cited

U.S. PATENT DOCUMENTS

| | | | | |
|---|---|---|---|---|
| 3,296,099 A | * | 1/1967 | Dinella | 205/126 |
| 4,543,715 A | * | 10/1985 | Iadarola et al. | 29/852 |
| 5,224,265 A | * | 7/1993 | Dux et al. | 29/852 |
| 6,147,876 A | * | 11/2000 | Yamaguchi et al. | 361/766 |
| 6,248,958 B1 | * | 6/2001 | McClure et al. | 174/256 |
| 6,452,112 B1 | * | 9/2002 | Terashima et al. | 174/260 |
| 6,534,726 B1 | * | 3/2003 | Okada et al. | 174/263 |

* cited by examiner

*Primary Examiner* — Ishwarbhai Patel
(74) *Attorney, Agent, or Firm* — Robert P. Lenart (57) ABSTRACT

A circuit board includes an electrically conductive sheet having an insulative coating surrounding the conductive sheet, with a surface of the insulative coating around an edge of the conductive sheet having an arcuate or rounded shape. At least one electrical conductor is conformally deposited on at least the rounded insulative coating around the edge of the conductive sheet and defined via photolithographic and metallization techniques. Each electrical conductor on the insulative coating thereon around the edge of the conductive sheet conforms to the arcuate or rounded shape of the insulative coating and, therefore, has an arcuate or rounded shape.

6 Claims, 10 Drawing Sheets

PRINTED CIRCUIT BOARD WITH IMPROVED VIA DESIGN

CROSS REFERENCE TO RELATED APPLICATION

This application is a divisional application of U.S. patent application Ser. No. 11/868,085, filed Oct. 5, 2007 now abandoned, which is a divisional application of U.S. patent application Ser. No. 11/442,016, filed May 26, 2006 now abandoned, which is a continuation-in-part of U.S. patent application Ser. No. 10/987,480, filed Nov. 11, 2004, now U.S. Pat. No. 7,485,812, which is incorporated herein by reference, which is a continuation-in-part of U.S. patent application Ser. No. 10/227,768, filed Aug. 26, 2002, now U.S. Pat. No. 6,844,504, which is incorporated herein by reference, which is a continuation-in-part of U.S. patent application Ser. No. 10/184,387, filed Jun. 27, 2002, now U.S. Pat. No. 6,951,707, which is incorporated herein by reference.

BACKGROUND OF THE INVENTION

Presently, printed circuit boards are fabricated as part of a larger panel. Each printed circuit board can be configured in any shape, although most printed circuit boards in common use are made in rectangular shapes of standard sizes. When fabrication of a printed circuit board is complete, it is cut and separated from the larger panel, mostly by way of a machine cutting or routing process in which a channel is cut around the printed circuit board. In certain designs, the channel around the printed circuit board does not completely encircle the perimeter of the printed circuit board. Rather, tabs are left at several places around the perimeter of the printed circuit board to attach it to the larger panel until the board is singulated from the larger panel by breaking the tabs. Typically, metal planes in the printed circuit board do not extend to its edge where they would be cut by the routing process. In this way, no conductive metal is left exposed on the edges of the printed circuit board.

The existing methods of cutting printed circuit boards from larger panels are unsatisfactory for high density boards because the limited dimensional stability of the printed circuit boards does not allow registration of one high density pattern to the next on the larger panel. Cut lines made around the periphery of the printed circuit board further weaken the panel material, exasperating misregistration of one pattern to the next.

Electronic systems assembled onto conventional printed circuit boards rely upon thermal conduction from integrated circuits dissipating heat to the printed circuit board to remove some of the heat from the integrated circuits. For intermediate ranges of heat, up to about 2 watts per chip, conduction to the printed circuit board is sufficient to cool the integrated circuits without the need for bulky and expensive heat sinks. In high performance systems, however, as the density of the system and the percentage of the substrate covered by the integrated circuits increases, the thermal path to the printed circuit board is less efficient. At a point when the density of the system increases sufficiently, the printed circuit board is not effective as a heat sink for the integrated circuits. However, the need for effective thermal conduction from the integrated circuits to the substrate and therefrom to the ambient becomes more important as system density increases. Because of the evolution toward higher system density and larger integrated circuit coverage, means are needed for cooling the substrate in order to maintain the integrated circuits on the substrate at a safe operating temperature.

In addition to thermal conduction, high performance systems increasingly require low impedance power and ground voltage supplies to run the integrated circuits at high clock speeds. Typically, the AC impedances of power and ground supplies are lowered by the use of low impedance bypass capacitors connected to the power and ground planes. On conventional printed circuit boards, capacitors are connected to power and ground planes through vias which extend through some thickness of the board, increasing the impedance of this contact and degrading performance of the system. As switching speeds increase, the problem of making low impedance connections between bypass capacitors and the power and ground planes becomes more important.

It would, therefore, be desirable to overcome the above problems and others by providing a printed circuit board having one or more printed circuit board layers each of which has a conductive layer which extends to the edge thereof and which is substantially, but not completely, covered by an insulating material. The edge of the conductive layer not covered by the insulating material can be on the perimeter (or edge) of the printed circuit board layer or on the edge of a tab which is utilized to couple the board to a disposable part of a larger panel that the board is formed from during fabrication. The exposed edge of the conductive layer becomes exposed upon singulating the printed circuit board layer from each tab connected thereto or upon breaking the tab during singulation of the printed circuit board from the disposable part of the larger panel. In one embodiment, the broken end of one or more tabs terminate in a recess in the perimeter of the printed circuit board. In a second embodiment, the broken end of one or more tabs extend outward from the perimeter of the printed circuit board.

The conductive plane can be formed from metal that can serve the dual purpose of conducting heat away from electrical components disposed on one or both surfaces of the printed circuit board or printed circuit board layer and for providing power or ground to the electrical components. The tab which extends outward from the edge of the second embodiment printed circuit board can be coupled to a mechanical fixture and/or an electrical fixture to provide a path for the flow of heat from the printed circuit board to externally coupled mechanical fixtures and/or to provide electrical power to the electrically conducting layer of the printed circuit board.

Each printed circuit board layer can include one or more landless through-holes or vias extending all or part of the way therethrough. Each landless through-hole or via is desirably configured to facilitate the deposition of conductive material therein, the patterning and etching of said conductive material and the formation of the through-hole or via without a conductive land on each exposed end thereof.

SUMMARY OF THE INVENTION

The invention is a circuit board that includes an electrically conductive sheet coated with an insulative coating that forms an insulating top layer covering one surface of the conductive sheet, an insulating bottom layer covering another surface of the conductive sheet and an insulating edge layer covering an edge of the conductive sheet, and a first electrical conductor on one of the top and bottom layers and on at least part of the insulating edge layer. The insulating edge layer and the portion of the first electrical conductor thereon each have an arcuate or rounded outline or shape. The portion of the first electrical conductor on the insulating edge layer is electrically isolated from the edge of the conductive sheet by the insulating edge layer.

The first electrical conductor can also be on the other layer of the circuit board. The portions of the first electrical conductor on the top and bottom layers of the circuit board are electrically connected by the portion of the first electrical conductor on the insulating edge layer.

The combination of the portion of the first electrical conductor and the insulating edge layer it overlays can be in a notch defined in the edge of the electrically conductive sheet.

The circuit board can include a second electrical conductor on the top and bottom layers of the circuit board that are electrically connected by a portion of the second electrical conductor on the insulating edge layer which can be in the notch in electrical isolation from the portion of the first electrical conductor in the notch.

The insulative coating can be initially electrodeposited and thereafter heated until it flows thereby forming the insulating edge layer having the arcuate or rounded shape.

The circuit board can further include a copper layer disposed between the electrically conductive sheet and the insulative coating.

The invention is also a method of forming a circuit board comprising: (a) providing an electrically conductive sheet having top and bottom surfaces and an edge desirably perpendicular thereto; (b) conformally coating the top and bottom surfaces and the edge of the electrically conductive sheet with an insulating material; (c) exposing the conformally coated insulating material to an elevated temperature such that the insulating material at least partially melts and flows around the edge of the electrically conductive sheet whereupon, upon removal of the elevated temperature, the insulating material around the edge of the electrically conductive sheet has an arcuate or rounded shape or outline; and (d) following step (c), forming a first conductor on the insulating material with at least a portion of the first conductor on the insulating material around the edge of the electrically conductive sheet, whereupon said portion of the first conductor has an arcuate or rounded shape or outline.

The first conductor can also be formed on the insulating material overlaying at least one of the top and bottom surfaces of the electrically conductive sheet.

The portion of the first conductor and the insulating material it overlays can be in a notch formed in a side of the electrically conductive sheet.

Step (d) can include forming a second conductor on the insulating material with at least a portion of the second conductor overlaying the insulating material in the notch, whereupon the portion of the second conductor has an arcuate or rounded shape or outline. The portion of the second conductor in the notch can be electrically isolated from said portion of the first conductor in the notch.

Step (b) can include electrodepositing the insulating material.

The portion of the first conductor electrically connects other portions of the first conductor on the insulating material overlaying the top and bottom surfaces of the electrically conductive sheet.

The invention is also a circuit board that comprises an electrically conductive sheet including an insulating edge layer covering an edge of the conductive sheet, and an electrical conductor on the insulating edge layer. The insulating edge layer and the electrical conductor thereon have an arcuate or rounded shape or outline.

The circuit board can further include the electrical conductor on an insulating top layer overlaying a top surface of the electrically conductive sheet and/or the electrical conductor on an insulating bottom layer overlaying a bottom surface of the electrically conductive sheet.

The combination of the electrical conductor and the insulating edge layer it overlays can be in a notch in the edge of the conductive sheet.

The circuit board can further include another electrical conductor on the insulating edge layer in the notch, wherein the electrical conductors on the insulating edge layer in the notch are spaced from each other.

The circuit board can further include another electrical conductor on the insulating edge layer outside the notch.

Lastly, the invention is a circuit board that comprises an electrically conductive sheet; an insulative coating surrounding the conductive sheet with a surface of the insulative coating around an edge of the conductive sheet being rounded; and at least one electrical conductor defined on at least the rounded insulative coating around the edge of the conductive sheet via photolithographic and metallization techniques, wherein each electrical conductor on the rounded insulative coating around the edge of the conductive sheet has a rounded surface.

The edge of the conductive sheet can define a notch therein where at least one electrical conductor formed on at least the rounded insulative coating resides. When two electrical conductors reside in the notch, the two electrical conductors can be electrically isolated from each other in the notch.

DETAILED DESCRIPTION OF THE INVENTION

Figure 1:
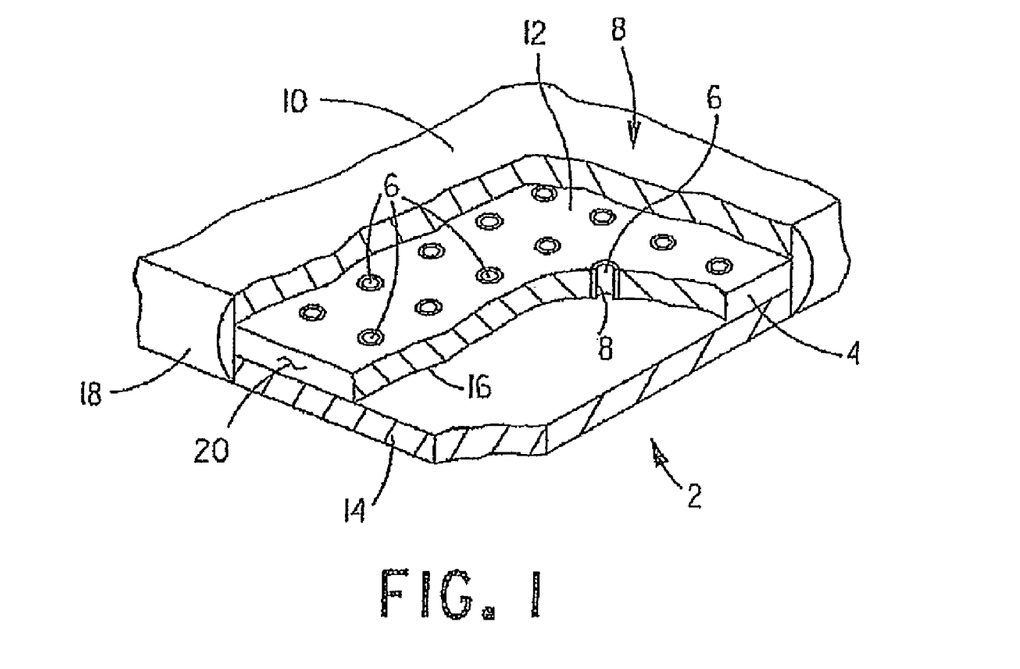
FIG. 1 is a cutaway perspective view of a printed circuit board layer having a perforate conductive plane surrounded by an insulating material in accordance with the present invention.

With reference to FIG. 1, a printed circuit board layer 2 includes an electrically conductive sheet or foil 4. Sheet 4 can be formed from a copper foil, an iron-nickel alloy, or combinations thereof. Sheet 4 can be a perforate sheet as shown in FIG. 1 or can be a solid sheet. It is desirable for sheet 4 to have a coefficient of thermal expansion comparable to that of silicon materials from which integrated circuits are typically prepared in order to avoid failure of adhesion joints utilized to adhere the integrated circuit or a packaged integrated circuit (not shown) to printed circuit board layer 2. Describing sheet 4 as perforate means that sheet 4 is a mesh sheet having a plurality of through-holes or vias 6 spaced at regular intervals.

An electrically insulative coating 8 is formed around sheet 4. This coating 8 can be formed around sheet 4 in any manner known in the art, such as conformal coating. More specifically, coating 8 forms an insulating top layer 10 which covers a top surface 12 of sheet 4, an insulating bottom layer 14 which covers a bottom surface 16 of sheet 4 and an insulating edge layer 18 which covers an edge 20 of sheet 4. When sheet 4 is coated with coating 8, an interior surface of each through-hole or via 6 is also coated with coating 8. Thus, no portion of sheet 4 is left uncovered by coating 8.

Figure 2:
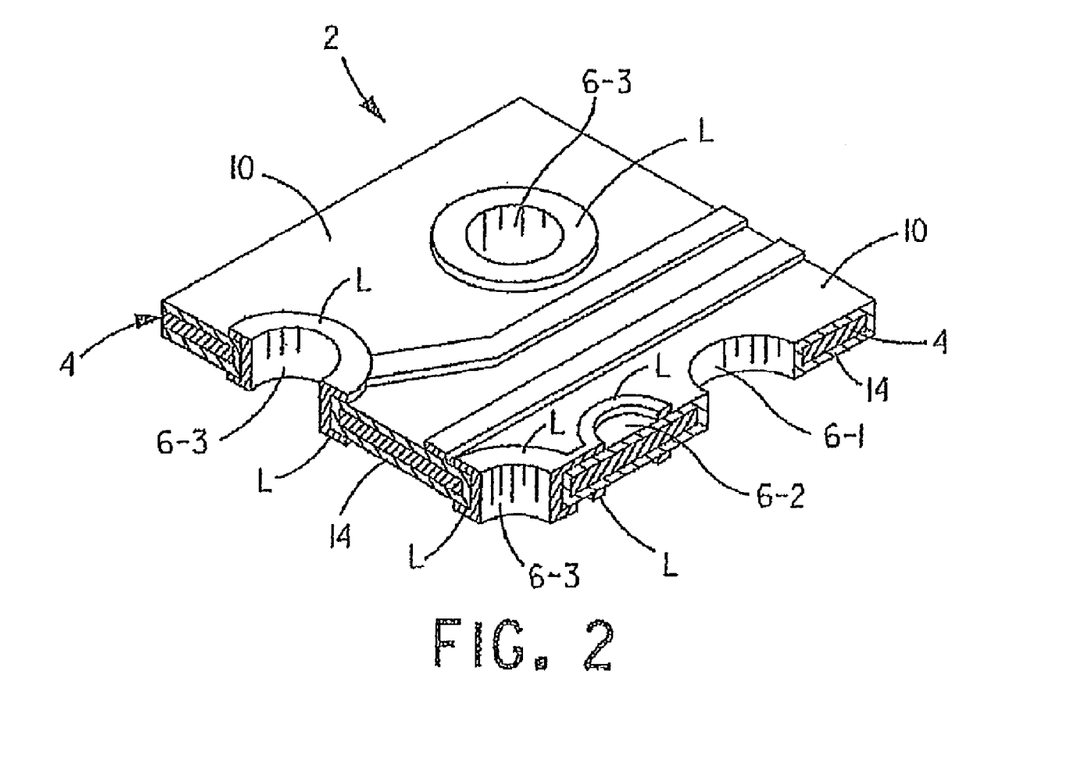
FIG. 2 is a cutaway perspective view of a portion of a printed circuit board layer of the type shown in FIG. 1 including a circuit pattern formed on the outward facing surfaces thereof.

With reference to FIG. 2 and with continuing reference to FIG. 1, printed circuit board layer 2 formed in the above-described manner can have a conductive pattern formed on the outward facing surface of top layer 10 and/or the outward facing surface of bottom layer 14 by conventional processes. Specifically, utilizing one or more photolithographic techniques and one or more metallization techniques, the conductive pattern can be formed on the outward facing surface of top layer 10 and/or the outward facing surface of bottom layer 14. This conductive pattern can include un-plated through-holes or vias 6-1, plated, blind through-holes or vias 6-2, and/or plated through-holes or vias 6-3. Additional details regarding formation of printed circuit board layer 2 and for forming a conductive pattern, including one or more of the various types of through-holes or vias 6, on top layer 10 and/or bottom layer 14 can be found in U.S. Pat. No. 6,951,707, dated Oct. 4, 2005, entitled "Process For Creating Vias For Circuit Assemblies" which is assigned to the same Assignee as the present application and which is incorporated herein by reference.

The preparation of one or more printed circuit board layers 2 in a panel form and the assembly of plural printed circuit board layers to form a multi-layer printed circuit board assembly will now be described.

Figure 3:
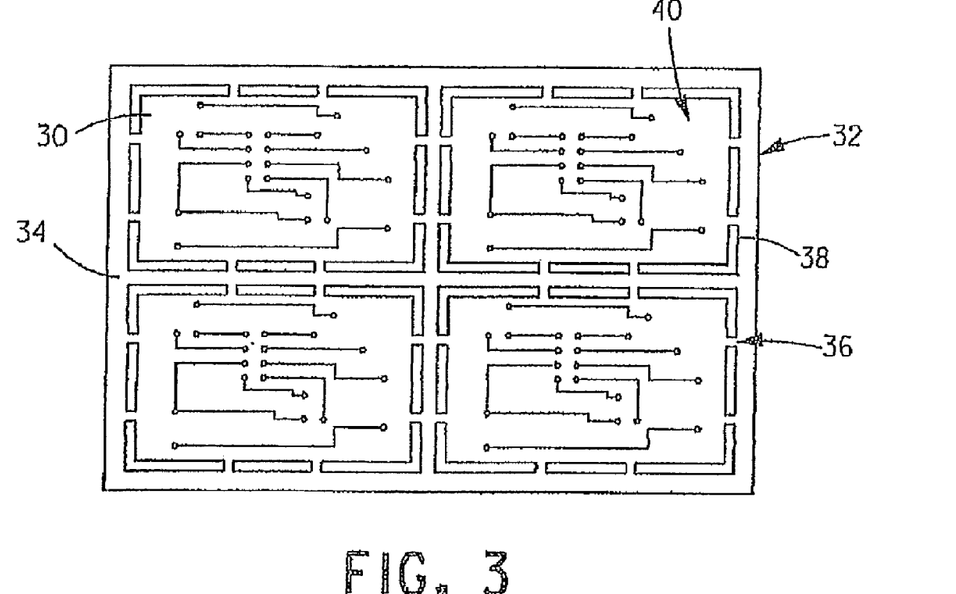
FIGS. 3 and 4 are plan views of panels having different circuit board layers formed therefrom in accordance with the present invention.

With reference to FIG. 3, one or more first printed circuit board (PCB) layers 30 are fabricated as part of a panel 32. Each first PCB layer 30 is surrounded by a disposable part 34 of panel 32. In accordance with the present invention, each first PCB layer 30 is coupled to disposable part 34 of panel 32 by one or more tabs 36.

The general steps to prepare panel 32 to the form shown in FIG. 3 will now be described. Initially, a first conductive sheet, like conductive sheet 4, of the size of panel 32 is provided. This sheet can either be a solid sheet or a perforate sheet depending on the application. Next, cut lines or slots 38 are formed in the conductive sheet by pattern etching or by a machine cutting or routing process to define the perimeter of each first PCB layer 30 of panel 32. These slots 38 are interrupted by tabs 36 which hold each first PCB layer 30 to disposable part 34 during processing.

Next, an electrically insulative coating, like coating 8, is deposited on the conductive sheet forming panel 32 in a manner whereupon the top surface, the bottom surface, and the edges of the electrically conductive sheet associated with each first PCB layer 30 that were exposed during the formation of slots 38 are covered thereby. If the conductive sheet is perforate, the electrically insulative coating also covers the interior surface of each through-hole or via. In addition, the top and bottom surfaces and the edges of each tab 36 defined during the formation of slots 38 can also be covered by the electrically insulative coating. The top and bottom surfaces and the edges of disposable part 34 defined during formation of slots 38 can also be covered with the electrically insulative coating. However, this is not required. Typically, however, all of the edges, surfaces and, if vias are provided, the interior surface of each via of the conductive sheet of panel 32 are covered by the electrically insulative coating.

Next, photolithographic processing techniques and metallization techniques known in the art and described in the above-identified United States patent application incorporated herein by reference are utilized to define a circuit pattern 40 on one or both of the exposed surfaces of the electrically insulative coating deposited on the portion of the electrically conductive sheet associated with each first PCB layer 30.

If each first PCB layer 30 is ready for use after circuit pattern 40 is formed thereon, each first PCB layer 30 can be singulated from panel 32 by applying a breaking force to each tab 36 connecting each first PCB layer 30 to disposable part 34. However, if desired, one or more additional layers of electrically insulative coating (not shown) and circuit patterns (not shown) can be formed over circuit pattern 40, with the various layers of circuit patterns interconnected in a desired manner utilizing conventional processes. Thereafter, each first PCB layer 30 can be singulated from panel 32 by applying a breaking force to each tab 36 connecting each first PCB layer 30 to disposable part 34. If the breaking force is applied to each tab 36 at the perimeter (or edge) of first PCB layer 30, i.e., at the boundary between tab 36 and first PCB layer 30, a portion of the edge of first PCB layer 30 where said tab was connected becomes exposed. More specifically, separating each tab 36 from first PCB layer 30 at the perimeter thereof exposes a portion of the edge of the conductive sheet of first PCB layer 30 where said tab 36 was previously connected.

Figure 4:
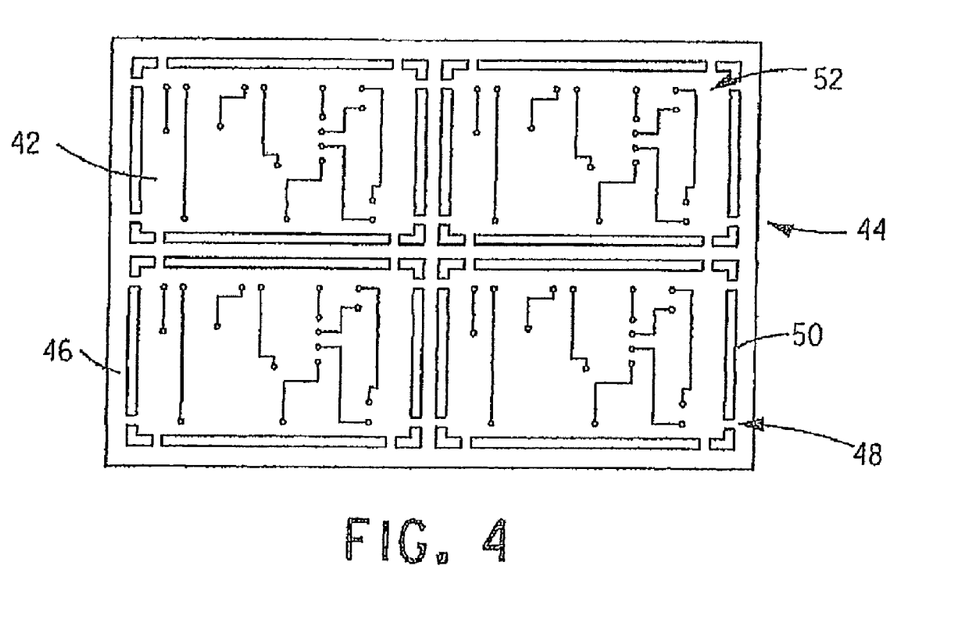

Alternatively, each first PCB layer 30 of panel 32 can be laminated to a second PCB layer 42 of a panel 44 shown in FIG. 4. Panel 44 includes one or more second PCB layers 42 connected to a disposable part 46 of panel 44 by tabs 48 defined during formation of slots 50 in the electrically conductive sheet of panel 44 in the same manner described above in connection with the formation of slots 38 in panel 32.

An electrically insulative coating is deposited on the conductive sheet forming panel 44 in a manner whereupon the top surface, the bottom surface and the edges of electrically conductive sheet associated with each second PCB layer 42 that were exposed during the formation of slots 50 are covered thereby. If the conductive sheet is perforate, the electrically insulative coating also covers the interior surface of each through-hole or via. In addition, the top and bottom surfaces and the edges of each tab 48 defined during the formation of slots 50 can also be covered by the electrically insulative coating. The top and bottom surfaces and the edges of disposable part 46 defined during formation of slots 50 can also be covered with the electrically insulative coating. However, this is not required. Typically, however, all of the edges, surfaces and, if vias are provided, the interior surface of each via of the conductive sheet of panel 44 are covered by the electrically insulative coating.

Each second PCB layer 42 has a circuit pattern 52 formed on one or both of the exposed surfaces of the electrically insulative coating deposited on the portion of the electrically conductive sheet associated with each second PCB layer 42. If desired, each second PCB layer 42 can include one or more additional layers of electrically insulative coating and circuit patterns formed over circuit pattern 52, with the various layers of circuit patterns interconnected in the desired manner utilizing conventional processes.

Figure 5:
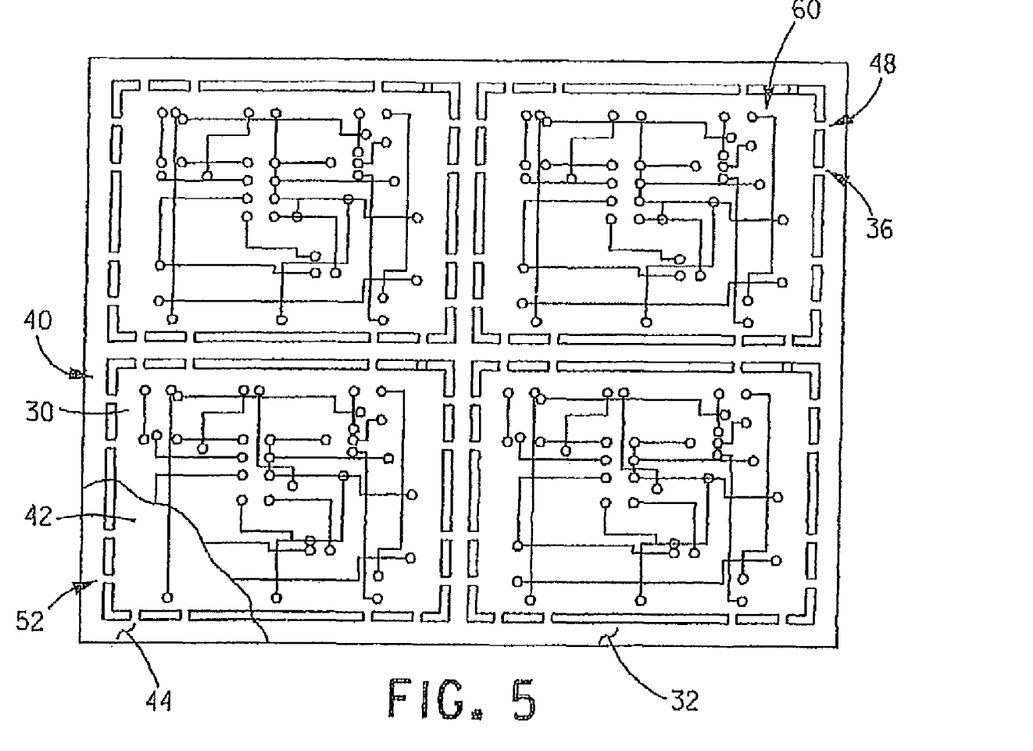
FIG. 5 is a plan view of the panels shown in FIGS. 3 and 4 laminated together with the circuit board layers thereof in registry.

With reference to FIG. 5 and with ongoing reference to FIGS. 3 and 4, panels 32 and 44 can be laminated together in a manner known in the art, with each first PCB layer 30 positioned in registry with a corresponding second PCB layer 42 to form a multi-layer PCB assembly 60. Appropriate techniques known in the art can be utilized to form one or more electrical connections between circuit pattern 40 and circuit pattern 52. For simplicity of description, the formation of these one or more electrical connections between circuit pattern 40 and circuit pattern 52 will not be described herein.

As shown best in FIG. 5, tabs 36 of panel 32 desirably do not overlay tabs 48 of panel 44 when panels 32 and 44 are laminated together. In this manner, PCB layers 30 and 42 forming each multi-layer PCB assembly 60 can be singulated from their disposable parts 34 and 46, respectively, independent of each other. If desired, however, one or more tabs 36 and 48 can be in alignment with each other when panels 32 and 44 are laminated.

Each second PCB layer 42 can be singulated from panel 44 by applying a breaking force to each tab 48 connecting each second PCB layer 42 to disposable part 46. The breaking force applied to each tab 48 can be applied at the perimeter (or edge) of the corresponding second PCB layer 42, i.e., at the boundary between tab 48 and second PCB layer 42, thereby exposing a portion of the edge of second PCB layer 42 and, more particularly, a portion of the edge of the conductive sheet of second PCB layer 42 where said tab 48 was previously connected.

Figure 6:
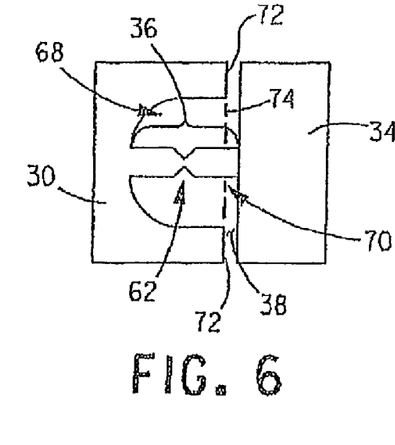
FIG. 6 is an isolated plan view of a tab which the panels in FIGS. 3 and 4 utilize to connect their circuit board layers to disposable parts of the panels.
Figure 7:
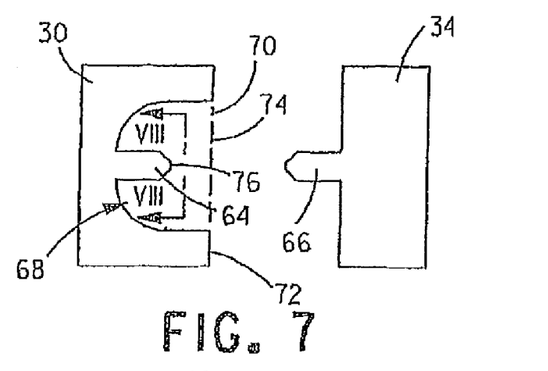
FIG. 7 is an isolated plan view of the tab shown in FIG. 6 after breaking in response to the application of a breaking force applied thereto.

With reference to FIGS. 6 and 7 and with continuing reference to FIGS. 3-5, alternatively, instead of breaking one or more tabs 36 and 48 at the perimeter (or edge) of the corresponding first PCB layer 30 and second PCB layer 42, respectively, one or more of tabs 36 and 48 can be configured to break intermediate the ends thereof to facilitate singulation of the corresponding PCB layers 30 and 42 from the corresponding disposable parts 34 and 46. If desired, the position where each such tab 36 and 48 is configured to break can be received within a recess of the corresponding PCB layer whereupon, after breakage, no portion of the tab remaining attached to the PCB layer extends outside a perimeter of the PCB layer. Each such tab 36 and 48 will now be described with respect to an exemplary tab 36 of panel 32. However, it is to be appreciated that each tab 48 of panel 44 is similar to each tab 36 of panel 32 and, therefore, the following description of exemplary tab 36 is applicable to each tab 48.

As shown in FIG. 6, exemplary tab 36 extends between first PCB layer 30 and disposable part 34. To facilitate breaking, exemplary tab 36 includes a narrowing 62, also known as a Charpy notch, along its length. This narrowing 62 enables exemplary tab 36 to break at a well-defined position whereupon exemplary tab 36 separates into a first part 64 that remains attached to first PCB layer 30 and a second part 66 that remains attached to disposable part 34.

The ends of slots 38 on opposite sides of exemplary tab 36 define a recess 68 within a perimeter 70 of first PCB layer 30. For purpose of the present description, perimeter 70 of first PCB layer 30 includes the outer edge 72 of first PCB layer 30 and the imaginary extension 74 of outer edges 72 across each recess 68. As shown, the narrowing 62 of each tab 36 is within perimeter 70 of first PCB layer 30. Hence, when exemplary tab 36 separates into first part 64 and second part 66, a distal end 76 of each first part 64 terminates within recess 68.

Figure 8:
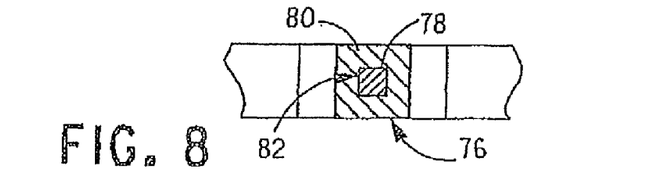
FIG. 8 is a view taken along lines VIII-VIII in FIG. 7.

With reference to FIG. 8 and with continuing reference to all previous Figs., since first PCB layer 30 and exemplary tab 36 include an electrically conductive sheet 78, like sheet 4 in FIG. 1, coated with an electrically insulative coating 80, like coating 8 in FIG. 1, breaking exemplary tab 36 exposes a small portion 82 of the edge of electrically conductive sheet 78 and the surrounding electrically insulative coating 80. Since only the distal end 76 of first part 64 of exemplary tab 36 includes small portion 82 of electrically conductive sheet 78 exposed, substantially all of the edge of electrically conductive sheet 78 is covered by electrically insulative coating 80 and, more particularly, the insulating edge layer of electrically insulative coating 80. Accordingly, inadvertent electrical contact with the edge of electrically conductive sheet 78 covered with the insulating edge layer of electrically insulative coating 80 is avoided.

The electrically conductive sheets of first PCB layer 30 and second PCB layer 42 can be utilized to conduct heat away from electrical components disposed on one or both surfaces thereof. In addition, the electrically conductive sheets of PCB layers 30 and 42 of each multi-layer PCB assembly 60 can be utilized to provide power and ground to electrical components disposed on the outward facing surfaces of multi-layer PCB assembly 60. This is accomplished by connecting the power lead of each integrated circuit disposed on multi-layer PCB assembly 60 to the conductive sheet of one PCB layer 30 and 42 and connecting the ground lead of each integrated circuit to the conductive sheet of the other PCB layer 30 and 42. The conductive sheet of each PCB layer 30 and 42 can then be connected to an appropriate one of a power terminal and a ground terminal of an external power supply via the small portion 82 of the edge of the electrically conductive sheet exposed on the first part 64 of one or more tabs 36 by suitable fixture means.

Figure 9:
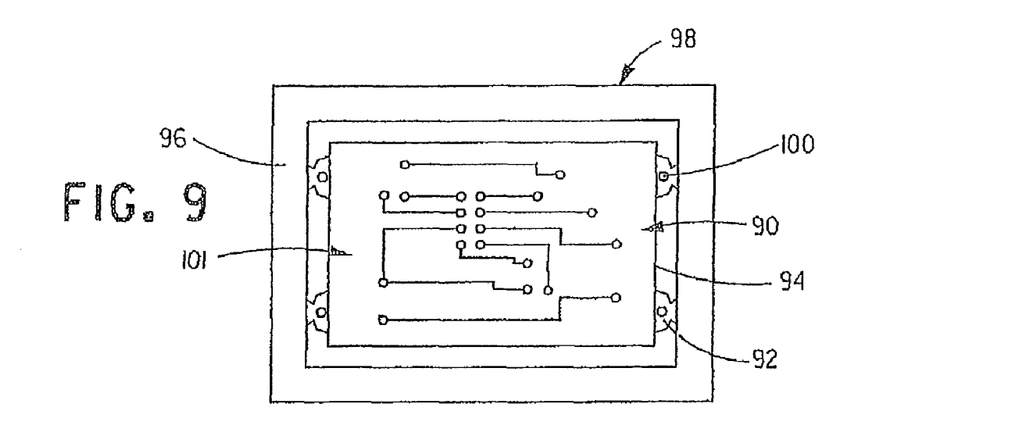
FIGS. 9 and 10 are plan views of panels including printed circuit board layers in accordance with the present invention.

With reference to FIG. 9, a first PCB layer 90 can be fabricated in the same manner as first PCB layer 30 discussed above in connection with FIG. 3. One or more tabs 92 can extend outward from a perimeter 94 of first PCB layer 90 and connect it to a disposable part 96 of a panel 98 that also includes first PCB layer 90 and tab 92. In a manner similar to PCB layers 30 and 42 and tabs 36 and 48, respectively, first PCB layer 90 and tabs 92 can be formed from an electrically conductive sheet having its top and bottom surfaces and edges coated with an electrically insulative coating. However, the electrically insulative coating can be omitted from one or more tabs 92 or can be removed from one or more tabs 92 after deposit. One or more of tabs 92 can each include a mounting hole 100 that can be utilized to couple tab 92 to mounting hardware or external electrical circuitry, such as a power supply.

A circuit pattern 101 can be formed on one or both exposed surfaces of first PCB layer 90 utilizing photolithographic processing techniques and metallization techniques known in the art. Once first PCB layer 90 has circuit pattern 101 formed on one or both exposed surfaces thereof, first PCB layer 90 and each tab 92 can be singulated from panel 98, especially disposable part 96, and utilized as is. If desired, however, one or more additional layers of electrically insulative coating and circuit patterns can be formed over circuit pattern 101, with the various layers of circuit patterns interconnected in a desired manner utilizing conventional processes. Thereafter, first PCB layer 90 and each tab 92 can be singulated from panel 98.

Figure 10:
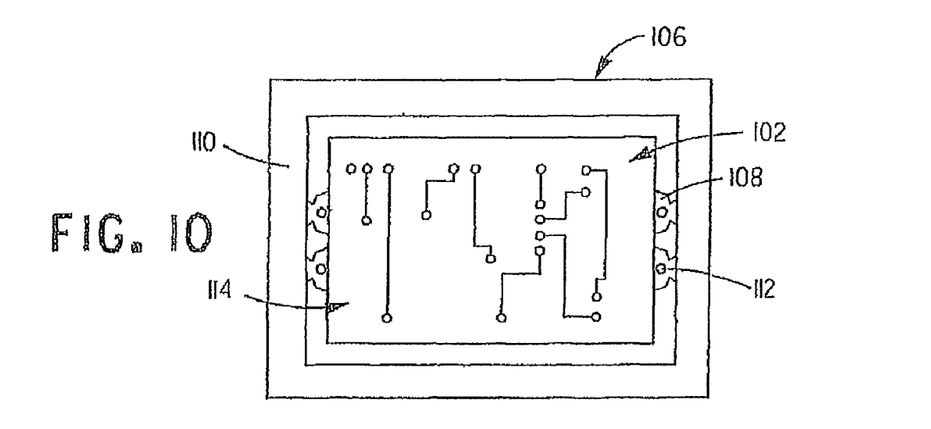
Figure 11:
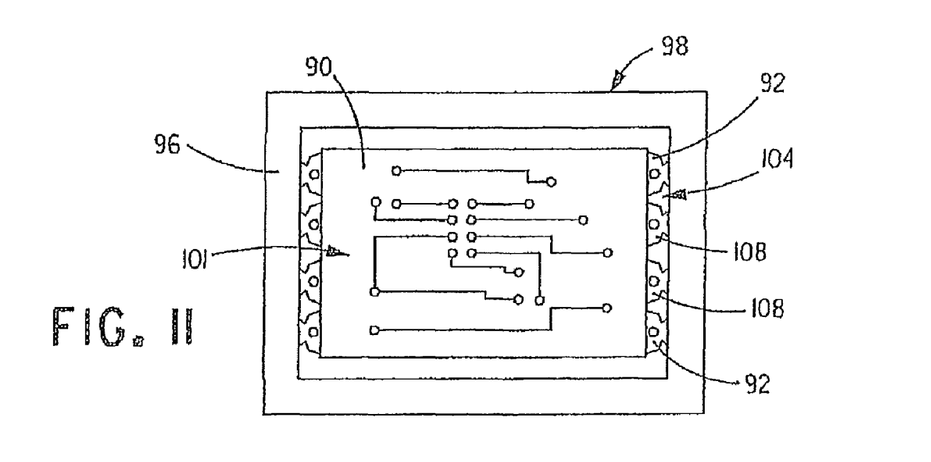
FIG. 11 is a plan view of the panels shown in FIGS. 9 and 10 laminated together with the circuit board layers thereof in registry.
Figure 12:
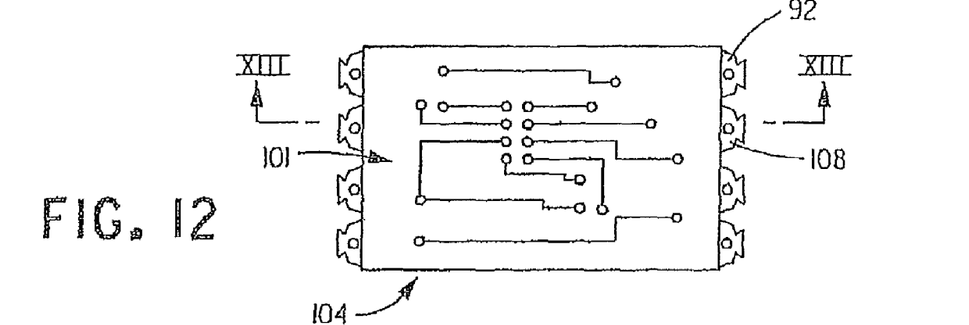
FIG. 12 is a plan view of the laminated printed circuit board layers shown in FIG. 11 singulated from the disposable parts of their respective panels.
Figure 13:
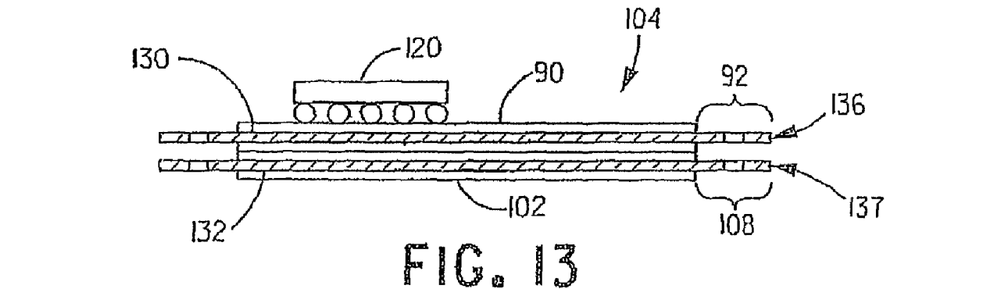
FIG. 13 is a section taken along lines XIII-XIII in FIG. 12.

With reference to FIGS. 10 and 11, if desired, panel 98 can be laminated to a panel 106 in a manner known in the art with first PCB layer 90 laminated in registry with a second PCB layer 102 of panel 106 to form a multi-layer PCB assembly 104, shown best in FIGS. 11-13. Second PCB layer 102 is part of panel 106 that includes tabs 108 and disposable part 110. One or more tabs 108 can each include a mounting hole 112 that can be utilized to couple tab 108 to appropriate mechanical hardware or electrical circuitry. In a manner similar to PCB layers 30 and 42 and tabs 36 and 48, respectively, second PCB layer 102 and tabs 108 can be formed from an electrically conductive sheet coated with an electrically insulative coating. However, the electrically insulative coating can be omitted from each tab 108 or can be removed from each tab 108 after deposit.

A circuit pattern 114 can be formed on one or both surfaces of second PCB layer 102 utilizing photolithographic processing techniques and metalization techniques known in the art. Appropriate techniques known in the art can be utilized to form one or more electrical connections between circuit pattern 101 and circuit pattern 114.

With reference to FIG. 12 and with continuing reference to FIG. 11, next, a breaking force can be applied to each tab 92 and 108 to singulate first and second PCB layers 90 and 102 and, hence, multi-layer PCB assembly 104, from disposable parts 96 and 110. To facilitate the application of a breaking force to each tab 92 and 108, tabs 92 and 108 can be positioned on first and second PCB layers 90 and 102 so that they do not overlay each other. As shown, all of each tab 92 and all of each tab 108 remains with first and second PCB layers 90 and 102, respectively. To this end, a breaking force applied to each tab 92 and each tab 108 causes it to break from disposable part 96 and 110, respectively. To enable each tab 92 and 108 to break cleanly from disposable parts 96 and 110, a break or score line can be formed at the boundary of each tab 92 and 108 and each disposable part 96 and 110 to weaken the mechanical connection therebetween. A suitable breaking force can be applied to each tab 92 and 108 by a mechanical press having a ram with a suitably shaped tip for causing the breaking force to be applied to the tab, especially the score line.

Alternatively, a breaking force can be applied to each tab 92 and 108 at the perimeter (or edge) of first and second PCB layers 90 and 102, respectively, i.e., at the boundary between each tab 92 and 108 and first and second PCB layers 90 and 102. Upon applying such breaking force, portions of the edges of first and second PCB layers 90 and 102 where tabs 92 and 108, respectively, were connected become exposed. More specifically, separating each tab 92 and 108 from first and second PCB layers 90 and 102, respectively, at the perimeters thereof exposes portions of the edges of the conductive sheets of first and second PCB layers 90 and 102 where said tabs 92 and 108 were previously connected.

Figure 14:
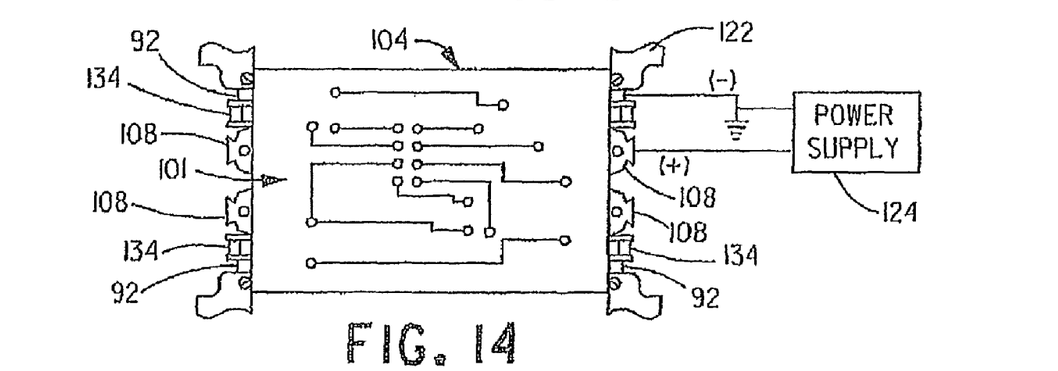
FIG. 14 is a plan view of the singulated laminated circuit board layers shown in FIG. 12 with certain tabs thereof coupled to a mounting fixture and with certain tabs thereof coupled to an electrical fixture.

With reference to FIG. 13, and with continuing reference to FIGS. 11 and 12, assuming that the breaking force applied to each tab 92 and each tab 108 causes it to break from disposable parts 96 and 110, respectively, at a suitable time one or more electrical components 120, such as, without limitation, a packaged integrated circuit, an unpackaged flip-chip integrated circuit, a resistor, a capacitor and/or an inductor, can be coupled to appropriate points of circuit pattern 101 and/or circuit pattern 114 of multi-layer PCB assembly 104 in a manner known in the art. Moreover, as shown in FIG. 14, one or more tabs 92 and/or 108 can be coupled to a mounting fixture 122 or an electrical fixture, such as a power supply 124. Since each tab 92 is part of an electrically conductive sheet 130 associated with first PCB layer 90, and since each tab 108 is part of an electrically conductive sheet 132 associated with second PCB layer 102, connecting one or more tabs 92 to one terminal of power supply 124 and connecting one or more tabs 108 to the other terminal of power supply 124 biases electrically conductive sheets 130 and 132 accordingly. The provisioning of electrical power to electrically conductive sheets 130 and 132 in this manner simplifies the provisioning of electrical power to each electrical component, e.g., electrical component 120, coupled to one or both outward facing surfaces of multi-layer PCB assembly 104.

In addition, other electrical components, such as one or more capacitors 134, can be connected between adjacent pairs of tabs 92 and 108. The inclusion of one or more capacitors 134 between adjacent pairs of tabs 92 and 108 reduces the need to install filter capacitors on one or both of the outward facing surfaces of multi-layer PCB assembly 104 to provide electrical filtering for electrical components disposed thereon.

Like the distal end of exemplary tab 36, the distal end 136 of each tab 92 and the distal end 137 of each tab 108 includes an exposed edge of electrically conductive sheet 130 and 132, respectively. In addition, all or part of the top surface and/or bottom surface of the electrically conductive sheets 130 and 132 associated with adjacent pairs of tabs 92 and 108, respectively, can be exposed in order to facilitate the connection of electronic components, such as capacitors 134, therebetween.

Figure 15:
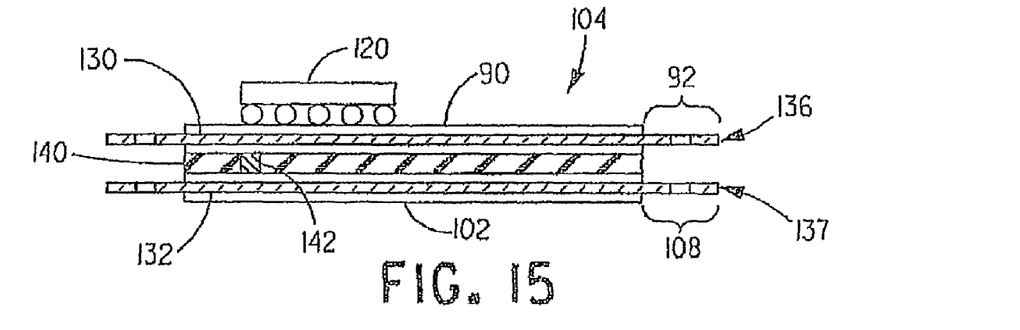
FIG. 15 is a cross sectional side view of the laminated printed circuit board layers of FIG. 12 including an optional insulating interlayer disposed therebetween and with an exemplary conductor disposed through the insulating interlayer for electrically connecting circuit patterns on the respective printed circuit board layers.

Multi-layer PCB assembly 104 includes one surface of the electrically insulative coating of first PCB layer 90 laminated directly to one surface of the electrically insulative coating of second PCB layer 102 as shown in FIG. 13. If desired, however, an insulating interlayer 140 can be provided between first and second PCB layers 90 and 102 as shown in FIG. 15. Specifically, one surface of first PCB layer 90 can be laminated to one surface of insulating interlayer 140 while the other surface of insulating interlayer 140 can be laminated to one surface of second PCB layer 102.

One or more conductors 142, such as small conductive posts, can protrude through insulating interlayer 140 for connecting one or more points of circuit pattern 101 on first PCB layer 90 to one or more points of circuit pattern 114 on second PCB layer 102. Since conductors, such as conductor 142, are known in the art, details regarding the use of such conductors will not be described herein.

While the use of insulating interlayer 140 has been described in connection with first and second PCB layers 90 and 102, it is to be appreciated that an insulating interlayer, like insulating interlayer 140, can also be utilized with multi-layer PCB assembly 60, shown in FIG. 5, in the same manner that insulating interlayer 140 is used with multi-layer PCB assembly 104, shown in FIG. 15. Specifically, one surface of each instance of first PCB layer 30 can be laminated to a surface of an insulating interlayer, like insulating interlayer 140, while the other surface of the insulating interlayer can be laminated to one surface of an instance of second PCB layer 42 to form an embodiment of multi-layer PCB assembly 60 that includes the insulating interlayer between first and second PCB layers 30 and 42.

In FIGS. 3-5 and 9-12, each PCB layer 30, 42, 90 and 102 is illustrated as including one or more conventional plated through-holes (or vias) therethrough. Each such conventional plated through-hole (or via) includes a so-called "land" L therearound on each end thereof that terminates on an exposed surface of the printed circuit board layer (see, e.g., FIG. 2). The use of land L around each end of a plated through-hole (or via) that terminates on an exposed surface of a printed circuit board layer enables the conductive material in the via to be electrically connected to a conductor, e.g., a conductive trace or line, on the surface of the printed circuit board in a manner known in the art. One problem with the use of land L around each end of a plated through-hole or via that terminates on an exposed surface of a printed circuit board layer is that the additional conductive material utilized to form land L provides increased opportunities for forming electrical shorts with adjacent conductive lines or lands L during installation of electrical components on the printed circuit board layer. Moreover, the use of lands L decrease the available density of conductor lines and lands on the printed circuit board layer. More specifically, printed circuit board layers are manufactured in accordance with rules regarding minimum spacing between edges of adjacent conductors, such as lands L and conductive lines. Accordingly, eliminating the land L around each exposed end of a through-hole or via would enable an adjacent structure, such as an adjacent land L or an adjacent conductive line, to be moved closer to the landless through-hole or via without violating the minimum spacing rule. Accordingly, it would be desirable to eliminate the use of a land L around each exposed end of a through-hole or via.

With reference back to FIG. 1, a method of forming printed circuit board layer 2 with a landless through-hole or via will now be described. As described above in connection with FIG. 1, printed circuit board layer 2 includes an electrically conductive sheet or foil 4 that is formed from a copper foil, an iron-nickel alloy, or combinations thereof. In one desirable embodiment, electrically conductive sheet 4 is formed of Invar. Sheet 4 can have one or more through-holes or vias 6 that extend through sheet 4.

Figure 16:
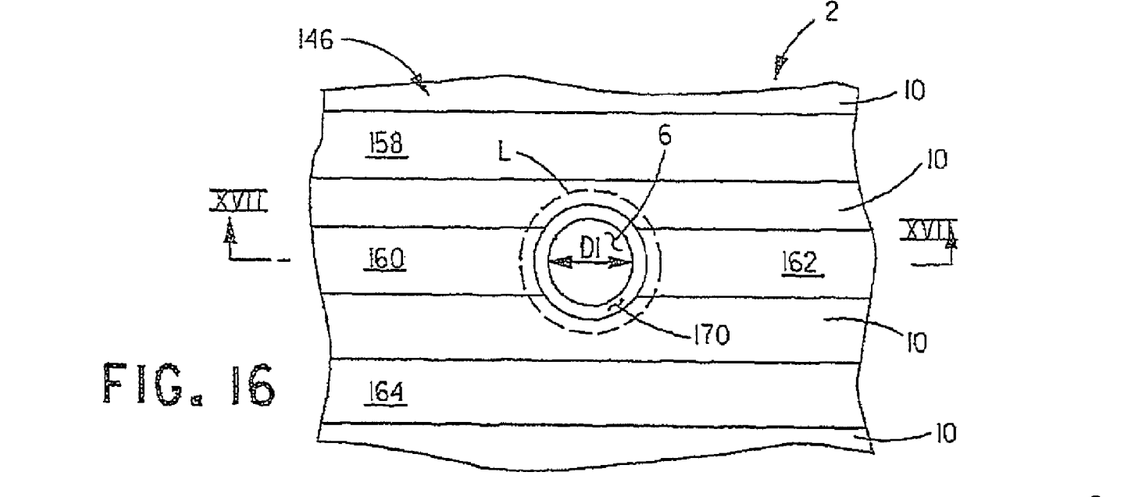
FIG. 16 is a plan view of an isolated section of a printed circuit board layer in accordance with the present invention including a landless through-hole (or via) having a single through-hole conductor therein.
Figure 17:
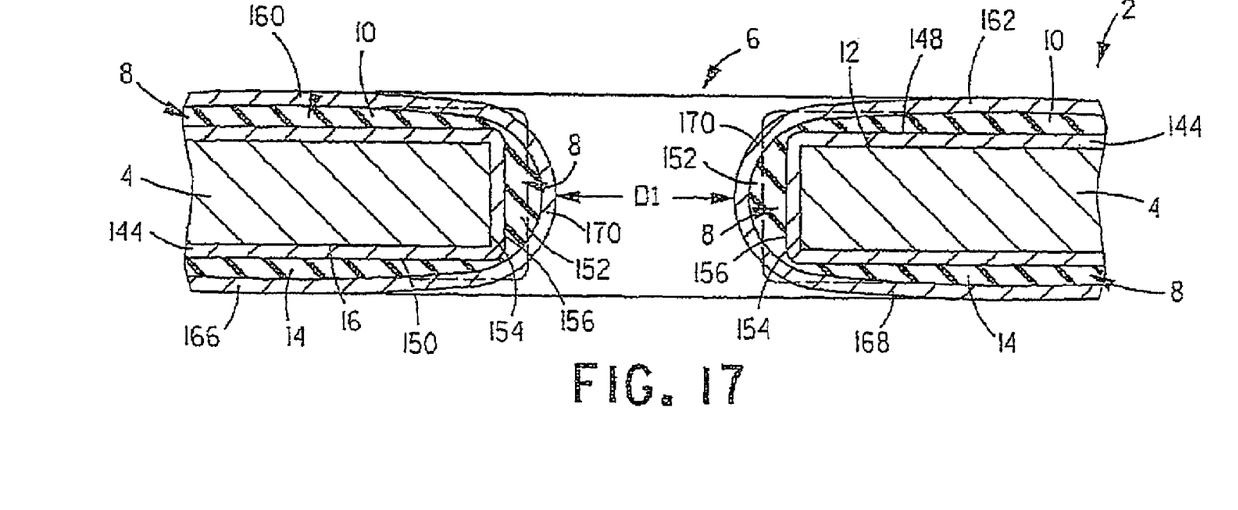
FIG. 17 is a section taken along lines XVII-XVII in FIG. 16.

With reference to FIGS. 16 and 17 and with continuing reference to FIG. 1, sheet 4, including each through-hole 6 therein, is optionally conformally coated with a copper layer 144. Desirably, copper layer 144 is electrodeposited on sheet 4. However, this is not to be construed as limiting the invention.

The use of copper layer 144 is particularly advantageous when sheet 4 is formed from a material other than copper in order to avoid mismatches between the thermal coefficient of expansion of the material forming sheet 4 and the thermal coefficient of expansion of materials deposited over copper layer 144 or electrical components mounted to printed circuit board layer 2.

Next, sheet 4 or copper layer 144, if present, is conformally coated with an insulative material to form coating 8. Desirably, the insulative material forming coating 8 is initially electrodeposited on sheet 4 or copper layer 144, if present. Electrodepositing this insulative material produces a substantially uniform layer that conforms to the surfaces and edges of sheet 4 or copper layer 144, if present. It has been observed that this substantially uniform layer of electrodeposited insulative material, however, has a relatively rough surface that is not desirable for forming a circuit pattern, e.g., circuit pattern 146, thereon. Accordingly, after the insulative material has been electrodeposited, PCB layer 2 is heated to an elevated temperature sufficient to cause the insulative material to wholly or partially melt. Upon melting, the insulative material deposited on the opposing surfaces of sheet 4 or copper layer 144, if present, flows and levels thereby becoming sufficiently flat so that when cooled provides a suitably smooth and uniform surface for forming circuit pattern 146 thereon. Melting the insulative material also enables it to flow around the edges of each through-hole 6. More specifically, melting the insulative material causes the shape of the insulative material in each through-hole 6 to change from its conformally coated shape shown in phantom in FIG. 17 to the shape shown in cross section in FIG. 17. When cooled back to a solid, the insulative material inside each through-hole 6 retains the shape substantially as shown in cross section in FIG. 17.

Upon cooling, the insulative material forms coating 8. Coating 8 includes insulating top layer 10, which covers top surface 12 of sheet 4 or top surface 148 of copper layer 144, if present, insulating bottom layer 14, which covers a bottom surface 16 of sheet 4 or a bottom surface 150 of copper layer 144, if present, an insulating edge layer 18 (shown best in FIG. 1), which covers an edge 20 of sheet 4, and, for each through-hole 6, an insulating through-hole layer 152 which covers an interior surface 154 of sheet 4 or an interior surface 156 of copper layer 144, if present.

As can be seen, once coating 8, especially insulating through-hole layer 152, is formed, the surface of insulating through-hole layer 152 converges from a position adjacent top layer 10 to a position intermediate top layer 10 and bottom layer 14, and diverges from the position intermediate top layer 10 and bottom layer 14 to a position adjacent bottom layer 14.

As shown in the cross section of through-hole 6 in FIG. 17, one side of insulating through-hole layer 152, has an arcuate outline. Moreover, as shown in the cross section of through-hole 6 in FIG. 17, opposing sides of insulating through-hole layer 152 have an outline generally in the shape of a hyperbola.

Once coating 8 is formed, a layer of copper is formed, e.g., electrodeposited, on coating 8, i.e., on top layer 10, bottom layer 14, insulating edge layer 18, and each insulating through-hole layer 152. Because each insulating through-hole layer 152 has the form shown in FIG. 17, the electrodeposited copper on coating 8 conforms to the arcuate surface of insulating through-hole layer 152. In other words, the copper electrodeposited on coating 8 conformally coats coating 8, especially the arcuate surface of insulating through-hole layer 152.

Next, the copper electrodeposited on coating 8 can be patterned and etched in a manner known in the art to define circuit pattern 146 thereon. Exemplary circuit pattern 146 includes conductive traces 158-164 on top layer 10, conductive traces 166 and 168 on bottom layer 14 and one or more through-hole conductors 170 on the surface of each insulating through-hole layer 152. As shown in FIG. 17, through-hole conductor 170 has a substantially uniformed thickness.

Opposing sides of the interior surface of through-hole conductor 170 have a minimum diameter D1. The arcuate surface of insulating through-hole layer 152 enables electrical connection to be established between through-hole conductor 170 and conductive traces 160, 162, 166 and 168 without the need for a land L, shown in phantom in FIG. 16.

Figure 18:
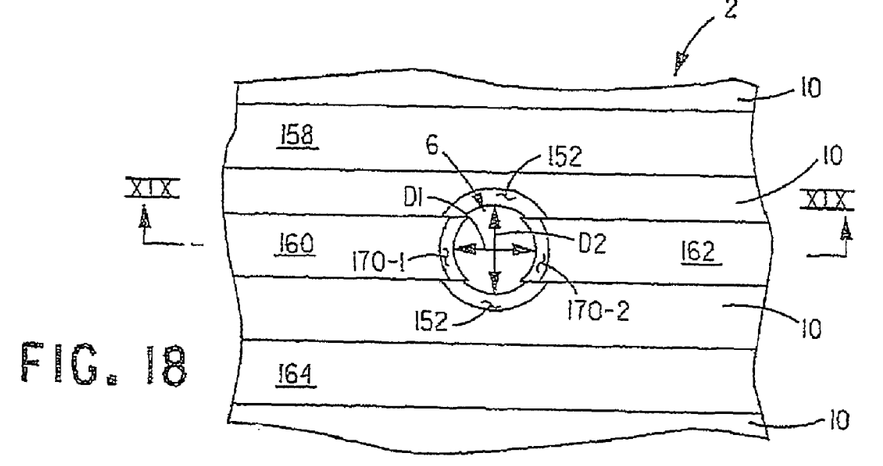
FIG. 18 is a plan view of a printed circuit board layer in accordance with the present invention including a landless through-hole (or via) having a plurality of through-hole conductors therein.
Figure 19:
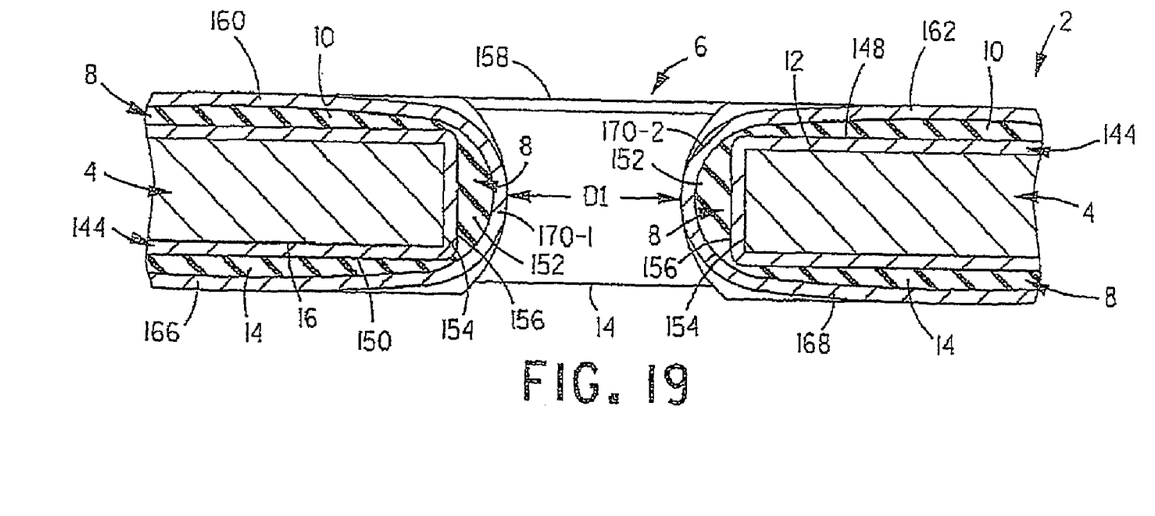
FIG. 19 is a section taken along lines XIX-XIX in FIG. 18.

With reference to FIGS. 18 and 19 and with continuing reference to FIGS. 1, 16 and 17, if desired, instead of through-hole 6 including a single through-hole conductor 170, through-hole 6 can include a plurality of electrically isolated through-hole conductors 170-1, 170-2, etc., formed on insulating through-hole layer 152. Each through-hole conductor 170-1, 170-2, etc., can be utilized to electrically connect a conductive trace defined on top layer 10 to a conductive trace defined on bottom layer 14. For example, through-hole conductor 170-1 can be utilized to electrically connect conductive trace 160 and conductive trace 166 disposed on top layer 10 and bottom layer 14, respectively, of coating 8. Similarly, through-hole conductor 170-2 can be utilized to electrically connect conductive trace 162 and conductive trace 168 disposed on top layer 10 and bottom layer 14, respectively, of coating 8.

The ability to form a plurality of electrically isolated through-hole conductors 170 on insulating through-hole layer 152 is facilitated by the arcuate shape of insulating through-hole layer 152 and, thereby, the arcuate shape of the copper electrodeposited on insulating through-hole layer 152. More specifically, the arcuate shape of the copper electrodeposited on insulating through-hole layer 152 enables photoresist to be deposited thereon and then patterned and etched in a manner known in the art. Thereafter, unhardened photoresist and the copper underlying said unhardened photoresist can be removed by means known in the art, such as chemical etching, to define the plurality of through-hole conductors 170-1, 170-2, etc., in through-hole 6. Thereafter, hardened photoresist can be removed by means known in the art.

As shown best in FIG. 18, removing portions of the copper deposited on insulating through-hole layer 152 to define the plurality of through-hole conductors 170 in through-hole 6 results in through-hole 6 having a minimum diameter D1 between the surfaces of opposing through-hole conductors 170. In contrast, opposing surfaces of insulating through-hole layer 152 where the electrodeposited copper has been removed will have a second diameter D2 that is larger than diameter D1.

The photoresist utilized to define the plurality of through-hole conductors 170 in through-hole 6 is desirably an electrodeposited photoresist that conformally coats the copper electrodeposited on insulating through-hole layer 152 of through-hole 6. Suitable exemplary electro-depositable photoresists are disclosed in U.S. Pat. No. 6,560,053 to Kahle, II et al.; U.S. Pat. No. 5,733,479 to Kahle, II et al.; U.S. Pat. No. 5,721,088 to Martin et al.; and U.S. Pat. No. 6,100,008 to McMurdie, which are incorporated herein by reference.

The combination of the electrodeposited photoresist on the arcuate surface of the copper electrodeposited on insulating through-hole layer 152 of through-hole 6 facilitates exposure of the photoresist to a suitable curing radiation in order to define the plurality of electrically isolated through-hole conductors 170 on insulating through-hole layer 152. In contrast, the vertical surface of a prior art through-holes limit or prevent uniform exposure of the photoresist in the through-hole to curing radiation, especially exposure to collimated light that may be utilized to define one or more conductive traces, or any other portion of a circuit pattern, on top layer 10 and bottom layer 14 of coating 8.

A method of forming printed circuit board layer 2 with an edge contact or edge via will now be described with reference to FIGS. 20 and 21 and with reference back to FIGS. 1 and 16-19. As discussed above, edge 20 of sheet 4 can be optionally conformally coated with copper layer 144, which can also be utilized to optionally conformally coat each through-hole 6 in sheet 4 in the manner discussed above in connection with FIGS. 16-19. For the purpose of describing the present invention, it will be assumed that copper layer 144 is utilized to conformally coat edge 20 of sheet 4 and each through-hole or via 6 of sheet 4. However, this is not to be construed as limiting the invention.

Next, edge 20 of sheet 4 or the portion of copper layer 144, if present, covering edge 20 of sheet 4 is conformally coated with the insulative material utilized to form coating 8 defining insulating top layer 10, insulating bottom layer 14 and insulating edge layer 18, the latter of which covers edge 20 of sheet 4 or the portion of copper layer 144, if present, overlaying edge 20 of sheet 4. Desirably, the insulative material forming coating 8 is initially electrodeposited on sheet 4 or copper layer 144, if present, to form a substantially uniform layer of coating 8 that conforms to the surfaces and edges of sheet 4 or copper layer 144, if present.

After the insulative material utilized to form coating 8 has been electrodeposited, printed circuit board layer 2 is heated to an elevated temperature sufficient to cause the insulative material to wholly or partially melt. Upon melting, the insulative material deposited on the opposing surfaces of sheet 4 or copper layer 144, if present, flows and levels thereby becoming sufficiently flat so that, when cooled, provides a suitably smooth and uniform surface for forming a circuit pattern thereon. Melting the insulative material also enables it to flow around the edges of each through-hole via 6 and around edge 20 of sheet 4 or the portion of copper layer 144, if present, overlaying edge 20 of sheet 4. More specifically, melting the insulative material causes the shape of insulating edge layer 18 to change from its conformally coated shape shown in phantom in FIG. 21 to the arcuate or rounded outline or shape shown in cross section in FIG. 21. When cooled back to a solid, the insulative material forming insulating edge layer 18 assumes the shape substantially as shown in cross section in FIG. 21.

Once coating 8 is formed, a layer of copper is formed (e.g., electrodeposited, electroplated, seed electroplated, metal vapor deposited, sputtered or any other suitable and/or desirable method of providing a uniform layer of copper) on coating 8, i.e., on one or more of top layer 10, bottom layer 14, insulating edge layer 18 and/or in each insulating through-hole layer 152. Because insulating edge layer 18 has the form shown in cross section in FIG. 21, the copper electrodeposited on coating 8 conforms to the arcuate or rounded surface of insulating edge layer 18.

Next, the copper electrodeposited on coating 8 can be patterned and etched in a manner known in the art to define a circuit pattern 200 thereon. Exemplary circuit pattern 200 includes conductive traces 202-204 on top layer 10, bottom layer 14 and insulating edge layer 18. However, circuit pattern 200 is not to be construed as limiting the invention since it is envisioned that the conductive traces of circuit pattern 200 can be disposed on any combination of top layer 10, bottom layer 14 and/or insulating edge layer 18. When deposited on insulating edge layer 18, a conductive trace of circuit pattern can extend between top layer 10 and bottom layer 14, as shown in FIGS. 20 and 21, or laterally thereto along all or part of the circumference of insulating edge layer 18.

The ability to form conductive traces 202-206 around insulating edge layer 18 is facilitated by the arcuate shape of insulating edge layer 18 and, thereby, the arcuate shape of the copper electrodeposited on insulating edge layer 18. More specifically, the arcuate shape of the copper electrodeposited on insulating edge layer 18 enables photoresist to be deposited thereon and then patterned and etched in a manner known in the art. Thereafter, unhardened photoresist and the copper underlying said unhardened photoresist can be removed by means known in the art, such as chemical etching, to define conductive traces 202-206 on top surface 10, bottom surface 18 and insulating edge layer 18 of coating 8.

Photoresist that can be utilized to define conductive traces 202-206 is desirably an electro-depositable photoresist of the type disclosed in U.S. Pat. No. 6,560,053 to Kahle, II, et al.; U.S. Pat. No. 5,733,479 to Kahle, II, et al.; U.S. Pat. No. 5,721,088 to Martin et al.; or U.S. Pat. No. 6,100,008 to McMurdie, which are incorporated herein by reference.

The combination of the electrodeposited photoresist on the arcuate or rounded surface of the copper electrodeposited on insulating edge layer 18 facilitates exposure of said photoresist to a suitable curing radiation in order to define the portions of conductive traces 204-206 on insulating edge layer 18. In contrast, the vertical surface of the edge of a prior art printed circuit board limits or prevents uniform exposure of photoresist on said vertical surface to curing radiation, especially exposure to collimated light that may be utilized to define conductive traces 202-204, or any other portion of circuit pattern 200, on top layer 10 and/or bottom layer 14 of coating 8.

Figure 20:
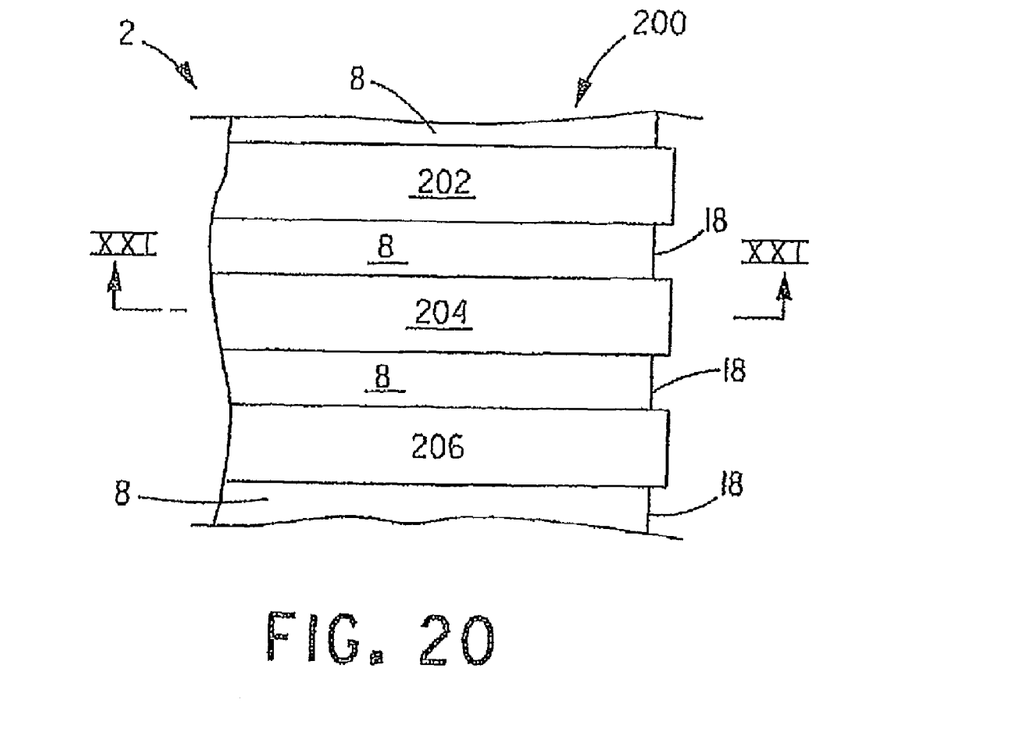
FIG. 20 is a plan view of a printed circuit board layer in accordance with the present invention including a circuit pattern having conductive traces, each of which extends around an arcuate or rounded edge of the printed circuit board.
Figure 21:
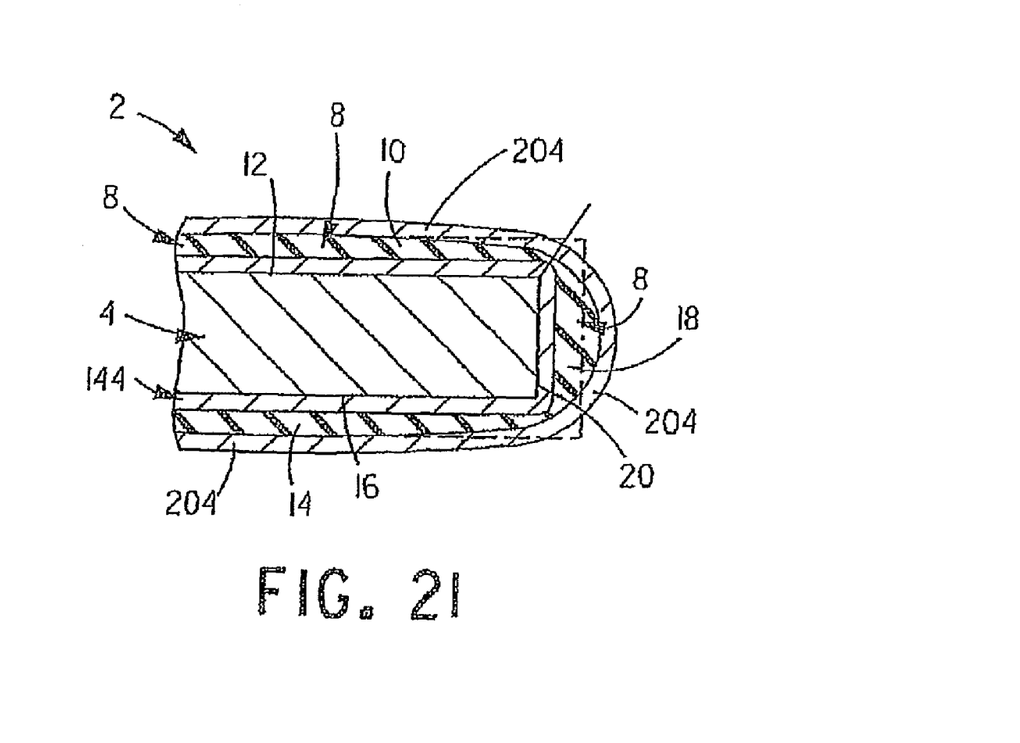
FIG. 21 is a section taken along lines XXI-XXI in FIG. 20.

The illustration of FIGS. 20 and 21 of conductive traces residing on top and bottom layers 10 and 14 of coating 8 is not to be construed as limiting the invention since it is envisioned that each conductive trace can reside on only one of top layer 10 and bottom layer 14 of coating 8, with or without a portion of each conductive trace extending about all or part of insulating edge layer 18.

If desired, the portion or the portions of one or more of conductive traces 204-206 covering insulating edge layer 18 can be connected to another conductor of the same or another printed circuit board layer 2 by any suitable and/or desirable conductive means. The other conductor can be, for example, a connection to a power supply, a conductive trace on another printed circuit board, and the like.

Figure 22:
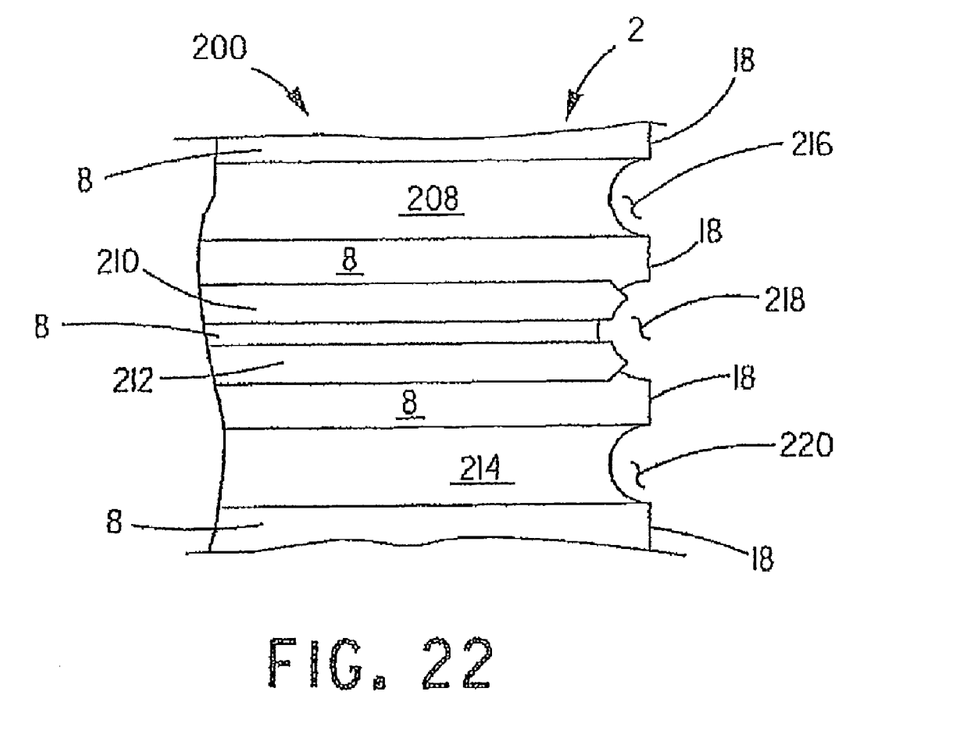
FIG. 22 is a plan view of a printed circuit board layer in accordance with the present invention including a circuit pattern having a plurality of conductive traces around interiors of notches, having arcuate or rounded edges, formed in an edge of the printed circuit board.

With reference to FIG. 22 and with continuing reference to FIGS. 1, 20 and 21, also or alternatively, exemplary circuit pattern 200 can include conductive traces 208-214 formed on top layer 10 and/or bottom layer 14 of coating 8. In addition, each conductive trace 208-214 can include a portion thereof received in a notch or half via 216-220 formed in edge 20 of sheet 4. More specifically, the insulating edge layer 18 of coating 8 can be disposed in each notch 216-220 in the manner discussed above for the embodiments of via 6 disclosed in connection with FIGS. 16-19.

As shown, the portion of conductive traces 208 and 214 can be formed in all or part of the corresponding insulating edge layer 18 inside notches 216 and 220, respectively, in the manner disclosed above for through-hole conductor 170 in FIGS. 16 and 17. Also or alternatively, the portions of conductive traces 210 and 212 on the insulating edge layer 18 inside notch 218 are deposited in the manner disclosed above for through-hole conductors 170-1 and 170-2 in FIGS. 18 and 19.

Essentially, in the embodiment shown in FIG. 22, notches 216 and 220 are similar to one half of via 6 shown in FIG. 17 while notch 218 is similar to one half of via 6 shown in FIG. 19 with the exception that conductive traces 210 and 212 are positioned adjacent each other within notch 218 whereas through-hole conductors 170-1 ! 170-2 of through hole 6 in FIG. 19 are in opposition.

Figure 23:
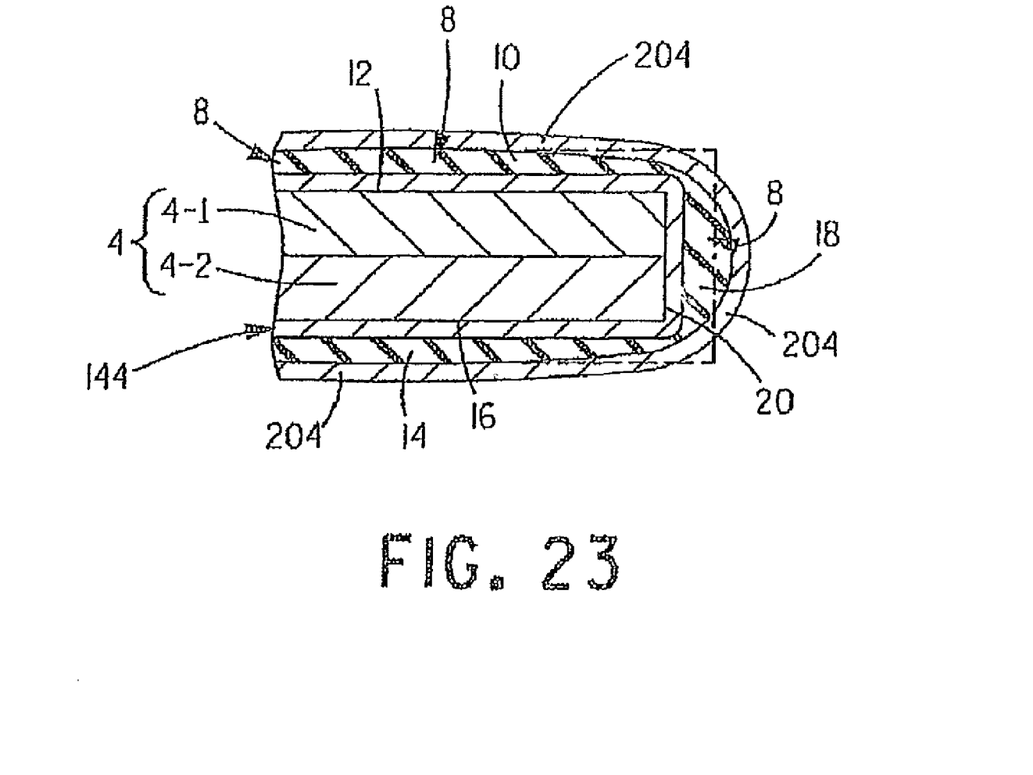
FIG. 23 is a cross-section of a printed circuit board layer in accordance with the present invention having multiple laminated conductive interior layers or sheets.
Figure 24:
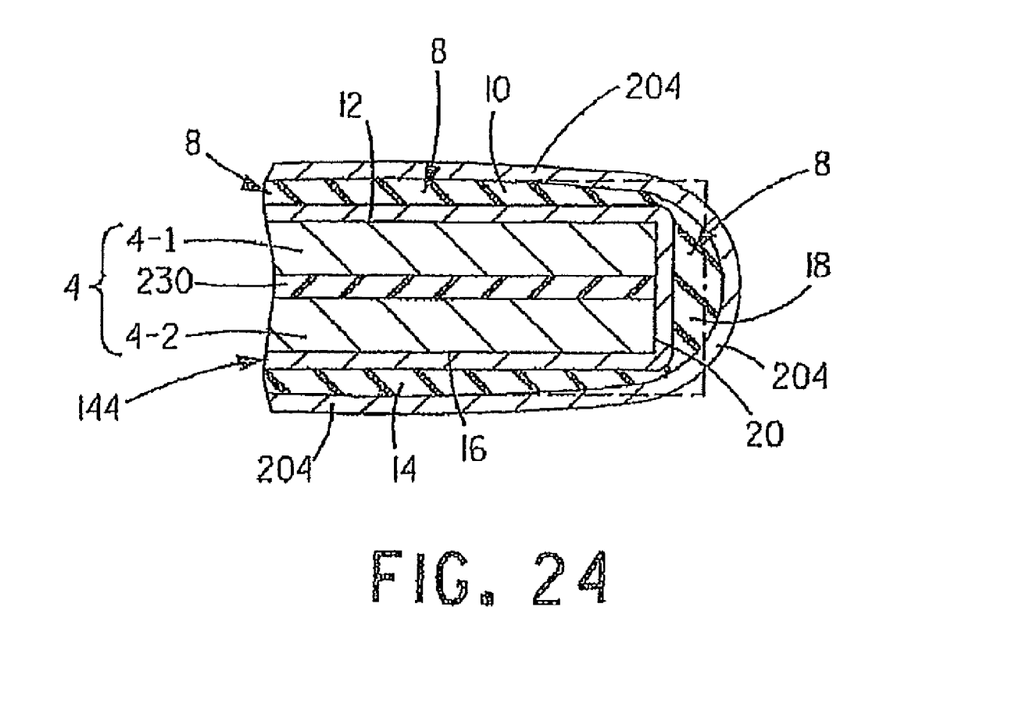
FIG. 24 is a cross-section of a printed circuit board layer in accordance with the present invention having a laminated interior stack comprised of a first conductive layer or sheet, an insulating layer, and a second conductive layer or sheet.

With reference to FIG. 23, heretofore, each instance of sheet 4 was described as being a single sheet or layer. However, this is not to be construed as limiting the invention since, as shown in FIG. 23, sheet 4 can be multi-layer comprised of a first sheet or layer 4-1 laminated to a second sheet or layer 4-2. Each sheet or layer 4-1 and 4-2 can be made from any suitable and/or desirable material such as a copper foil, an iron-nickel alloy, or combinations thereof. Moreover, as shown in FIG. 24, sheet 4 can be comprised of a laminated stack comprised of first sheet or layer 4-1, an insulating layer 230, and second sheet or layer 4-2. The illustration of sheets 4 in FIGS. 23 and 24, however, is not to be construed as limiting the invention since it is envisioned that sheet 4 can have any suitable and/or desirable configuration.

Two or more printed circuit board layers 2 described above in connection with FIGS. 16-22 can be utilized to form a multi-layer printed circuit board assembly, like multi-layer PCB assembly 60 or 104, with or without insulating interlayer 140 sandwiched between two or more adjacent printed circuit board layers 2. Like printed circuit board layers 40, 52, 90 and 102, the printed circuit board layers 2 shown in FIGS. 16-22 can be connected to a disposable part of a panel via one or more tabs, like tabs 36, 48, 92 or 108, and can be singulated from the panel in any one of the manners described above in connection with printed circuit board layers 40, 52, 90 and 102.

As can be seen, the present invention provides a printed circuit board having one or more printed circuit board layers each of which has a conductive plane that extends to the edge of the printed circuit board but which can be substantially, but not completely, covered by an insulating material. The edge of the conductive layer not covered by the insulating material is positioned on the edge of the circuit board layer or a tab which is utilized to couple the circuit board layer to a disposable part of a larger panel that the printed circuit board layer is formed from during fabrication. The exposed edge of the conductive layer becomes exposed upon singulating the printed circuit board layer from the disposable part of the panel.

The conductive layer of each circuit board layer can serve the dual purpose of conducting heat away from electrical components disposed on one or both surfaces of the printed circuit board or printed circuit board layer and providing power or ground to the electrical components.

The present invention also provides a printed circuit board layer having one or more landless through-holes therethrough. Desirably, in cross section, one side of the interior surface of each through-hole has an arcuate outline. In one desirable embodiment, in cross section, opposing sides of the interior surface of the through-hole have an outline generally in the shape of a hyperbola. Because the interior surface of one side of each through-hole has an arcuate outline in cross section, each through-hole can include a single through-hole conductor extending therethrough or a plurality of electrically isolated through-hole conductors extending therethrough. The ability to form a number of electrically isolated through-hole conductors in a single through-hole enables a reduction in the number of through-holes through the circuit board that are required for passing signals between opposing surfaces or layers thereof. Thus, the use of landless through-holes or vias in accordance with the present invention is capable of reducing the number of through-holes or vias required in a printed circuit board to pass signals between opposing surfaces of the printed circuit board.

Lastly, the present invention also provides a printed circuit board having one or more conductive traces, each of which can include a portion thereof on an arcuate or rounded edge of the printed circuit board. Desirably, in cross section, each such conductive trace portion has an arcuate or rounded shape. Moreover, each such conductive trace portion can either be disposed on or around a straight edge of the printed circuit board or can be disposed on or around a notch formed in the edge of the printed circuit board. If desired, two or more of said conductive trace portions can be received in the same notch, when provided. The use of one or more conductive traces on or around the edge of a printed circuit board can provide more connection options and can reduce the need for through-holes or vias in the printed circuit board to pass signals between conductive traces on opposing surfaces of the printed circuit board. In addition, the use of one or more conductive traces on or around the edge of the printed circuit board provides more connection options to other devices, such as, without limitation, a power supply, another printed circuit board, etc. For example, one end of a conductive wire can be connected (e.g., soldered) to the conductive trace or portion thereof on the arcuate or rounded edge of the printed circuit board, either on a straight edge or notch thereof, while the other end of the conductive wire can be connected to any desired connection point, e.g., without limitation, a trace or through-hole of the same or another printed circuit board, a terminal post of a power supply, etc.

The present invention has been described with reference to the preferred embodiments. Obvious modifications and alterations will occur to others upon reading and understanding the preceding detailed description. For example, multi-layer PCB assembly 60 was described as being formed by laminating together PCB layers 30 and 42 with or without an insulating layer, like insulating interlayer 140, laminated between PCB layers 30 and 42. However, a multi-layer PCB assembly can be formed from three or more PCB layers laminated together, with or without an insulating layer, like insulating interlayer 140, laminated between one or more adjacent pairs of PCB layers, with the circuit pattern of each pair of adjacent PCB layers electrically connected in a desired manner. Moreover, an electrical component, e.g., capacitor 134, was described as being connected to tabs 92 and 108 of adjacent PCB layers 90 and 102 of multi-layer PCB assembly 104. However, an electrical component can be connected between tabs of adjacent or non-adjacent PCB layers of a multi-layer PCB assembly having three or more PCB layers. It is intended that the invention be construed as including all such modifications and alterations insofar as they come within the scope of the appended claims or the equivalents thereof.

The invention claimed is:

1. A circuit board comprising:
   an electrically conductive sheet coated with an insulative coating that forms an insulating top layer covering one surface of the conductive sheet, an insulating bottom layer covering another surface of the conductive sheet and an insulating edge layer covering an edge of the conductive sheet;
   a first electrical conductor on the insulating top layer and the insulating bottom layer and on at least part of the insulating edge layer, wherein the insulating edge layer and a portion of the first electrical conductor thereon each have an arcuate or rounded shape in a direction perpendicular to a plane of the electrically conductive sheet, and the portion of the first electrical conductor on the insulating edge layer is electrically isolated from the edge of the conductive sheet by the insulating edge layer, the combination of the portion of the first electrical conductor and the insulating edge layer it overlays being positioned in a notch defined in an outer edge of the circuit board; and
   a second electrical conductor on the insulating top layer and the insulating bottom layer and on at least part of the insulating edge layer which is in the notch, wherein a portion of the second electrical conductor on the insulating edge layer is electrically isolated from the portion of the first electrical conductor in the notch, the notch has an arcuate shape in the plane of the electrically conductive sheet.

2. The circuit board of claim 1, wherein the insulative coating is initially electrodeposited and thereafter is heated until it flows thereby forming the insulating edge layer having the arcuate or rounded shape.

3. The circuit board of claim 1, further including a copper layer disposed between the electrically conductive sheet and the insulative coating.

4. A circuit board comprising:
   an electrically conductive sheet including an insulating edge layer covering an edge of the conductive sheet; wherein the insulating edge layer is in a notch in an outer edge of the circuit board;
   a first electrical conductor on the insulating edge layer; and
   a second electrical conductor on the insulating edge layer and electrically isolated from the first conductor, wherein the insulating edge layer and the first and second electrical conductors have an arcuate or rounded shape or outline in a direction perpendicular to a plane of" the electrically conductive sheet, the notch has an arcuate shape in the plane of" the electrically conductive sheet, the notch has an arcuate shape in the plane of the electrically conductive sheet.

5. The circuit board of claim 4, wherein:
   the first and second electrical conductors are also on an insulating top layer overlaying a top surface of the electrically conductive sheet; and
   the first and second electrical conductors are also on an insulating bottom layer overlaying a bottom surface of the electrically conductive sheet.

6. A circuit board comprising:
   an electrically conductive sheet;
   an insulative coating surrounding the conductive sheet with a surface of the insulative coating around an edge of the conductive sheet being rounded in a direction perpendicular to a plane of the electrically conductive sheet; and
   at least two electrical conductors conformally deposited on at least the rounded insulative coating around the edge of the conductive sheet and defined via photolithographic and metallization techniques such that said electrical conductors on the rounded insulative coating around the edge of the conductive sheet have a rounded surface in a direction perpendicular to a plane of the electrically conductive sheet, wherein an outer edge of the circuit board defines a notch therein and the electrical conductors are formed on at least the rounded insulative coating in the notch, the notch has an arcuate shape in the plane of the electrically conductive sheet.

* * * * *